(12) United States Patent
Choi

(10) Patent No.: US 12,083,898 B2
(45) Date of Patent: Sep. 10, 2024

(54) BATTERY SYSTEM

(71) Applicant: LG ENERGY SOLUTION, LTD., Seoul (KR)

(72) Inventor: Jinhwee Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 378 days.

(21) Appl. No.: 17/437,537

(22) PCT Filed: May 7, 2020

(86) PCT No.: PCT/KR2020/006007
§ 371 (c)(1),
(2) Date: Sep. 9, 2021

(87) PCT Pub. No.: WO2020/262818
PCT Pub. Date: Dec. 30, 2020

(65) Prior Publication Data
US 2022/0144095 A1    May 12, 2022

(30) Foreign Application Priority Data

Jun. 25, 2019  (KR) .......................... 10-2019-0075937

(51) Int. Cl.
*B60L 3/00*   (2019.01)
*B60L 3/04*   (2006.01)
(Continued)

(52) U.S. Cl.
CPC ............... *B60L 3/0046* (2013.01); *B60L 3/04* (2013.01); *B60L 58/19* (2019.02); *G01R 31/382* (2019.01);
(Continued)

(58) Field of Classification Search
CPC .......... B60L 3/0046; B60L 58/19; B60L 3/04; G01R 31/382; H01M 10/425; H02J 7/0031
See application file for complete search history.

(56) References Cited

U.S. PATENT DOCUMENTS

2005/0083797 A1   4/2005  Shigeeda et al.
2008/0213643 A1   9/2008  Escorihuela
(Continued)

FOREIGN PATENT DOCUMENTS

CN    103683368 A     3/2014
DE    102014218850 A1 *  3/2016  .............. B60L 11/18
(Continued)

OTHER PUBLICATIONS

English Machine Translation of DE102014218850A1 (Year: 2014).*
(Continued)

*Primary Examiner* — Andrew J Cromer
(74) *Attorney, Agent, or Firm* — Birch, Stewart, Kolasch & Birch, LLP

(57) ABSTRACT

A battery system includes a battery cell assembly including at least two battery cell modules, a first main relay, a second main relay, a first sub-relay, and a second sub-relay, and in response to a fault being detected in a battery cell in one of battery cell modules, controlling the first and second main relays and the first and second sub-relays to stop operation of the battery cell module having the battery cell with the detected fault.

15 Claims, 5 Drawing Sheets

(51) Int. Cl.
  *B60L 58/19* (2019.01)
  *G01R 31/382* (2019.01)
  *H01M 10/42* (2006.01)
  *H02J 7/00* (2006.01)
(52) U.S. Cl.
  CPC ......... *H01M 10/425* (2013.01); *H02J 7/0031* (2013.01); *H01M 2010/4271* (2013.01); *H01M 2220/20* (2013.01)

(56) References Cited

U.S. PATENT DOCUMENTS

| | | | |
|---|---|---|---|
| 2010/0127663 | A1 | 5/2010 | Furukawa et al. |
| 2011/0286137 | A1 | 11/2011 | Bosch et al. |
| 2014/0062413 | A1 | 3/2014 | Kim |
| 2014/0315048 | A1* | 10/2014 | Yang ................. H01M 10/48 429/61 |
| 2015/0180091 | A1* | 6/2015 | Dupont ............... H01M 10/052 429/61 |
| 2016/0114695 | A1 | 4/2016 | Holgers et al. |
| 2021/0152079 | A1 | 5/2021 | Jang |

FOREIGN PATENT DOCUMENTS

| | | |
|---|---|---|
| JP | 9-294338 A | 11/1997 |
| JP | 2001-186677 A | 7/2001 |
| JP | 2008-516574 A | 5/2008 |
| JP | 2012-517211 A | 7/2012 |
| JP | 2016-119788 A | 6/2016 |
| JP | 2016-140163 A | 8/2016 |
| JP | 2016-524895 A | 8/2016 |
| JP | 2018-107936 A | 7/2018 |
| KR | 10-2003-0018937 A | 3/2003 |
| KR | 10-2005-0026360 A | 3/2005 |
| KR | 10-2010-0059685 A | 6/2010 |
| KR | 10-2014-0013250 A | 2/2014 |
| KR | 10-2014-0052327 A | 5/2014 |
| KR | 10-2014-0091109 A | 7/2014 |
| KR | 10-2018-0013489 A | 2/2018 |
| KR | 10-2018-0026947 A | 3/2018 |
| WO | WO 99/50946 A1 | 10/1999 |
| WO | WO 2018/216850 A1 | 11/2018 |

OTHER PUBLICATIONS

Extended European Search Report dated Mar. 30, 2022, of the corresponding European Patent Application No. 20831710.7.
International Search Report (PCT/ISA/210) issued in PCT/KR2020/006007 mailed on Sep. 3, 2020.

* cited by examiner

BATTERY SYSTEM

TECHNICAL FIELD

This application claims priority to and the benefit of Korean Patent Application No. 10-2019-0075937 filed in the Korean Intellectual Property Office on Jun. 25, 2019, the entire contents of which are incorporated herein by reference.

The present disclosure relates to a battery system. In particular, it relates to a battery system applicable to an electric vehicle.

BACKGROUND ART

In the case of an automatic driving level 4 of the electric vehicle, the electric vehicle is operated without a driver's intervention even in a dynamic driving condition. The automatic driving level 4 is one of automatic driving steps of the National Highway Traffic Safety Administration (NHTSA), signifying a level at which a vehicle finds its way to a destination by itself without intervention of the driver.

When a fault (e.g., a cell overvoltage) is generated in a battery mounted on a conventional electric vehicle, an alarm is generated from the battery, and a relay of the battery is opened after a predetermined time (e.g., ten seconds). An additional overvoltage of the battery may be prevented by the opening of the relay, and the battery may be prevented from explosion.

However, in the case of the automatic driving level 4, a state of passengers in the electric vehicle may be a state that may fail to monitor the vehicle (e.g., a sleeping state), and the electric vehicle may need to be run for a longer time than a predetermined time (e.g., ten seconds) because of other reasons. In the case of a battery fault, the relay of the battery is opened when a predetermine time passes, so an additional emergency battery is provided in preparation for an operation for more than a predetermined time, which becomes a cause of wasting a space of the electric vehicle, and reduction of a size and capacity of the battery and reduction of a normal driving distance may be generated.

DISCLOSURE

The present invention has been made in an effort to provide a battery system for driving a vehicle when a fault is generated to a battery.

An embodiment of the present invention provides a battery system including: a battery cell assembly including at least two battery cell modules, each battery cell module including at least one battery cell; a first fuse and a first main relay connected in series between a first end of the battery cell assembly and a first output end; a second fuse and a second main relay connected in series between a second end of the battery cell assembly and a second output end; a first sub-relay connected to a first node connected between the at least two battery cell modules and a second node connected between the first output end and the first main relay; and a second sub-relay connected to the first node and a third node between the second output end and the second main relay, wherein, in response to a fault generated at a first battery cell of a first battery cell module positioned on a first side with respect to the first node, the first sub-relay is turned on while the first main relay is closed, and the first main relay is turned off after a first time delay occurs, and wherein in response to a fault generated at a second battery cell of a second battery cell module positioned on a second side with respect to the first node, the second sub-relay is turned on while the second main relay is closed, and the second main relay is turned off after a second time delay occurs.

The first fuse may be disconnected during the first time delay, and the second fuse may be disconnected during the second time delay.

Another embodiment of the present invention provides a battery system comprising: a battery cell assembly including two battery cell module groups, each cell module group including configured with a plurality of cells; a first fuse and a first main relay connected in series between a first end of the battery cell assembly and a first output end; a second fuse and a second main relay connected in series between a second end of the battery cell assembly and a second output end; a first sub-relay connected to a first node connected between the two battery cell modules and a second node between the first output end and the first main relay; a second sub-relay connected to the first node and a third node between the second output end and the second main relay; and a battery management system configured to, in response to a battery cell being detected with a fault is detected from among the at least two battery cell module groups, intercept a first battery cell module group including the battery cell with a fault from a corresponding node from among the second node and the third node by turning off the main relay corresponding to the first battery cell module group from among the first and second main relays, and connect a second battery cell module group from among the two battery cell module groups and the corresponding node by turning on the sub-relay corresponding to the second battery cell module group from among the first and second sub-relays.

The battery management system may turn on the corresponding sub-relay while the corresponding main relay is closed, and it may turn off the corresponding main relay after a predetermined time delay occurs.

The fuse corresponding to the corresponding main relay from among the first and second fuses may be disconnected during the time delay.

The battery management system may include: a cell monitoring integrated circuit (IC) configured to obtain state information of the plurality of battery cells; a main control IC configured to receive the state information of the plurality of battery cells to determine a first battery cell module group among the two battery cell module groups, and generate a relay driving control signal for controlling driving of the first and second main relays and the first and second sub-relays; and a relay driver configured to generate a relay driving signal for driving the first and second main relays and the first and second sub-relays according to the relay driving control signal.

The relay driver may change a second relay driving signal of the corresponding sub-relay to an On level while a first relay driving signal of the corresponding main relay is positioned in an ON level, and may change the first relay driving signal to an Off level after a predetermined time delay occurs.

When the first battery cell module group is connected between the first node and the first fuse, the battery management system may turn on the first sub-relay while the first main relay is closed, and it may turn off the first main relay after a predetermined time delay occurs.

The first fuse may be disconnected during the predetermined time delay.

When the first battery cell module group is connected between the first node and the second fuse, the battery management system may turn on the second sub-relay while the second main relay is closed, and it may turn off the second main relay after a predetermined time delay occurs.

The second fuse may be disconnected during the predetermined time delay.

According to an embodiment of the present invention, the battery system for safely driving an electric vehicle when a fault is generated to a battery is provided.

MODE FOR INVENTION

Figure 1:
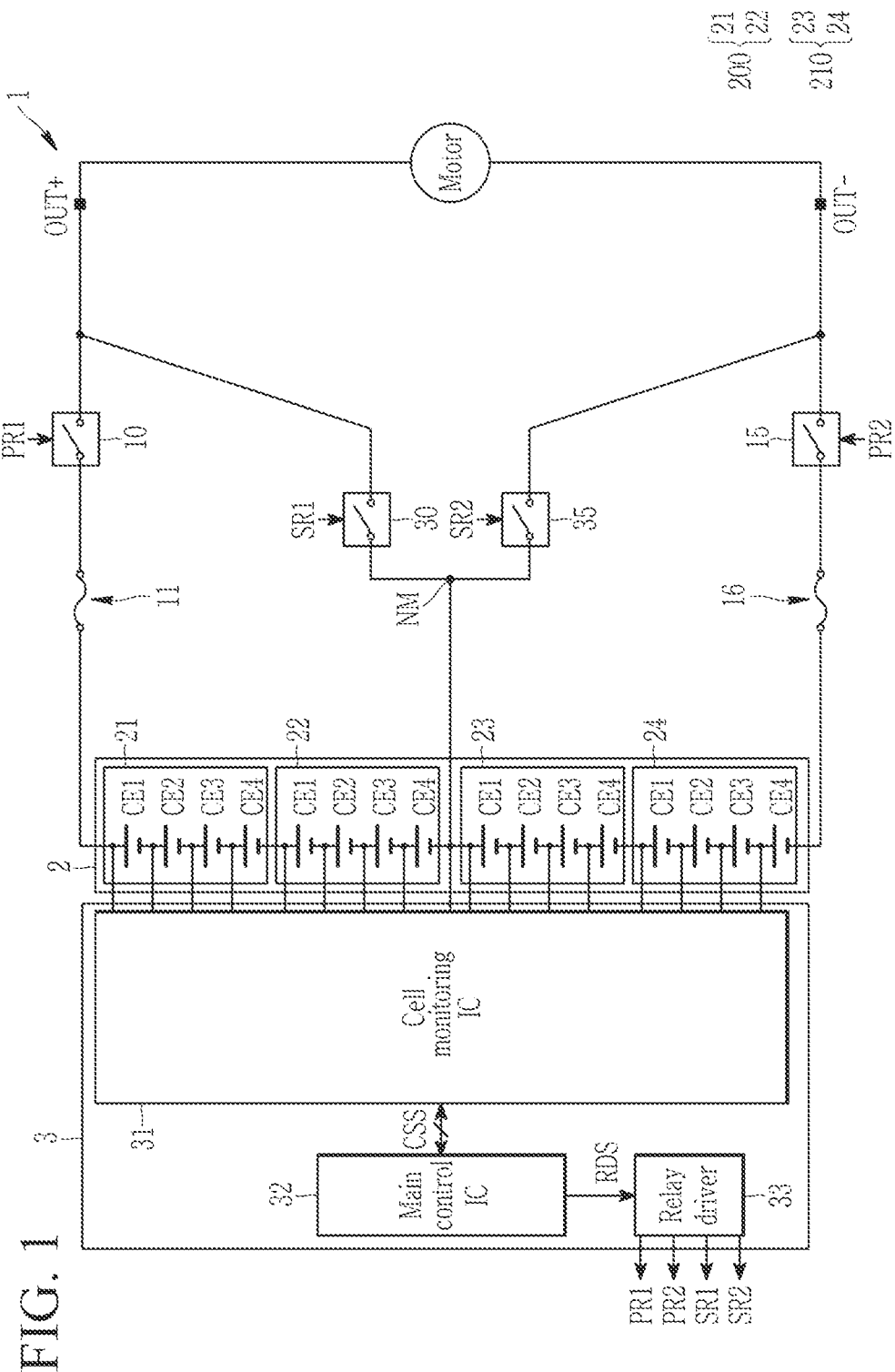
FIG. 1 shows a battery system according to an embodiment.

A battery system and a battery management method introduced in the present disclosure may intercept a battery cell region to which a fault is generated when the fault is generated to the battery, and operates an electric vehicle by using energy of a remaining battery cell region. The electric vehicle may acquire a sufficient time to move to a safety zone by using energy of the remaining battery cell region.

Hereinafter, exemplary embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing exemplary embodiments of the present specification, when it is determined that a detailed description of the well-known art associated with the present invention may obscure the gist of the present invention, it will be omitted. The accompanying drawings are provided only in order to allow exemplary embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not interpreted as limiting these components. The terms are only used to differentiate one component from others.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected or coupled to another component without the other component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 shows a battery system according to an embodiment.

As shown in FIG. 1, the battery system 1 includes a battery cell assembly 2, a battery management system (BMS) 3, two main relays 10 and 15, two fuses 11 and 16, and two sub-relays 30 and 35.

The battery system shown in FIG. 1 is connected to a motor of an electric vehicle and supplies a power to drive the motor.

The battery cell assembly 2 may be configured by connecting a plurality of battery cell modules in series/parallel, and it may supply a load, for example, power to the motor of the vehicle. It is shown in FIG. 1 that the battery cell assembly 2 includes four battery cell modules 21 to 24 connected in series, and the respective battery cell modules 21 to 24 respectively include four battery cells (CE1 to CE4) connected in series. This is an example for describing an embodiment, and is not limited thereto. A number of a plurality of battery cell modules and a number of battery cells in the battery cell modules may be modifiable according to designs, the battery cell assembly may include at least two battery cell modules, the battery cell module may include at least one cell, a connection of a plurality of battery cell modules is not limited to the connection in series, and the connection may be a connection in series, a connection in parallel, or a connection in series/parallel according to a needed power voltage.

The first fuse 11 and the first main relay 10 are connected in series between an output end (OUT+) of the battery system 1 and a positive electrode of the battery cell assembly 2, and the second fuse 16 and the second main relay 15 are connected in series between the output end (OUT−) of the battery system 1 and a negative electrode of the battery cell assembly 2.

In the battery cell assembly 2, a first sub-relay 30 is connected between a node (NM) on which two battery cell modules 21 and 22 and two battery cell modules 23 and 24 are connected to each other and the output end (OUT+), and a second sub-relay 35 is connected between the node (NM) and the output end (OUT−).

The first main relay 10, the second main relay 15, the first sub-relay 30, and the second sub-relay 35 may be switched according to relay driving signals (PR1, PR2, SR1, and SR2) applied by the BMS 3. Although not shown in FIG. 1, wires for transmitting driving signals to the respective relays may be formed.

The BMS 3 includes a cell monitoring integrated circuit (IC) 31, a main control integrated circuit (IC) 32, and a relay driver 33.

The cell monitoring IC 31 may be electrically connected to a plurality of battery cells (CE1 to CE4) configuring the battery cell modules 21 to 24, may sense information on the battery cells, and may transmit sensed information to the main control IC 32. The information on the battery cells may include a voltage and a temperature of the battery cells. Although not shown in FIG. 1, a current value measured by a sensor for sensing a current flowing through the battery cell assembly 2 may be transmitted to the cell monitoring IC 31. The cell monitoring IC 31 may transmit information on the current flowing through the battery cell assembly 2 to the main control IC 32.

The BMS 3 may analyze information on the battery cell transmitted from the cell monitoring IC 31, and may detect a cell to which a fault is generated from among a plurality of battery cells (CE1 to CE4) of a plurality of respective battery cell modules 21 to 24. The voltage at the cell to which a fault is generated may be greater than a predetermined threshold voltage. The BMS 3 drives the battery cell module group excluding the battery cell module group including the cell to which a fault is generated.

The main control IC 32 may generate a relay driving control signal (RDS) based on a position of the battery cell from which the fault is sensed, and may transmit the same to the relay driver 33.

The relay driver 33 may generate four relay driving signals (PR1, PR2, SR1, and SR2) according to the relay driving control signal (RDS).

A detailed method for driving a battery cell module in the case of a battery cell to which a fault is generated will now be described with reference to FIG. 2 to FIG. 5.

When a cell with a fault is generated from among a plurality of battery cells in the conventional battery system, the battery is used to maintain driving of a vehicle for a predetermined time. However, in the case of automatic driving, a driver may fail to drive the vehicle to a safe place for a predetermined time. In an embodiment, differing from the temporary reacting method for managing the entire battery for a predetermined time, power is supplied to the vehicle by using the battery cell module group including no cell with a fault.

A plurality of battery cell modules may be divided into at least two battery cell module groups. Referring to FIG. 1, two battery cell modules 21 and 22 form one battery cell module group, and two battery cell modules 23 and 24 form the other battery cell module group. The battery cell assembly 2 is divided into two battery cell module groups 200 and 210 in FIG. 1, but the present invention is not limited thereto, and it may be divided into two or more battery cell module groups by considering the number of a plurality of battery cell modules.

It will be referred to as On when the relay is changed to a closed state from an opened state, and it will be referred to as Off when the relay is changed to the opened state from the closed state. The On and Off will be referred to as switching.

The BMS 3 controls switching operations of the first main relay 10, the second main relay 15, the first sub-relay 30, and the second sub-relay 35 according to a state of the battery cell with a fault to intercept the battery cell module group (hereinafter, a fault battery cell module group) including a cell with a fault from a load, and supply power to the load through the battery cell module group (hereinafter, a normal battery cell module group) including no cell with a fault. The power is then supplied to the electric vehicle from the normal battery cell module group, and a sufficient time to move to the safe place may be obtained in the automatic driving mode.

The BMS 3 may generate driving signals (PR1, PR2, SR1, and SR2) for respective relays so as to control the switching operations of the first main relay 10, the second main relay 15, the first sub-relay 30, and the second sub-relay 35.

Figure 2:
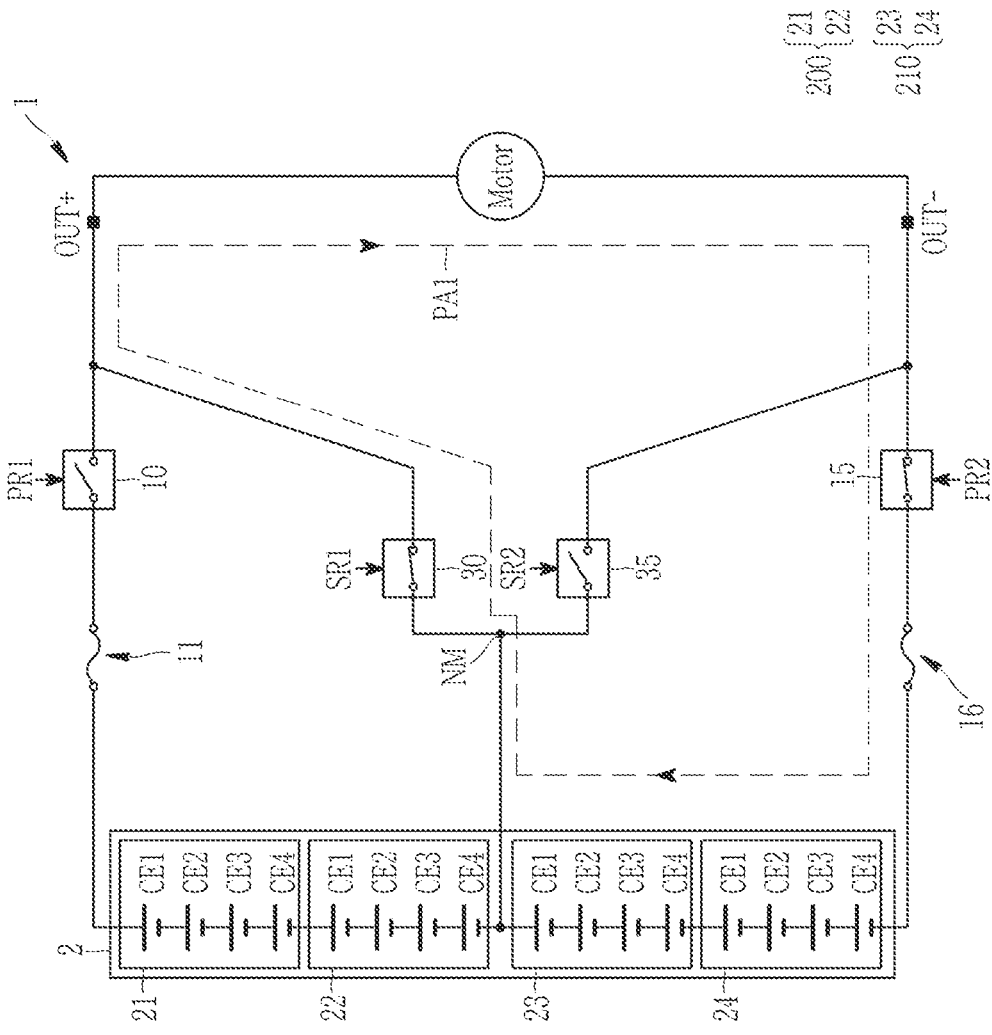
FIG. 2 shows an example of operating one of two battery cell module groups according to an embodiment.

FIG. 2 shows an example of operating one of two battery cell module groups according to an embodiment.

Figure 3:
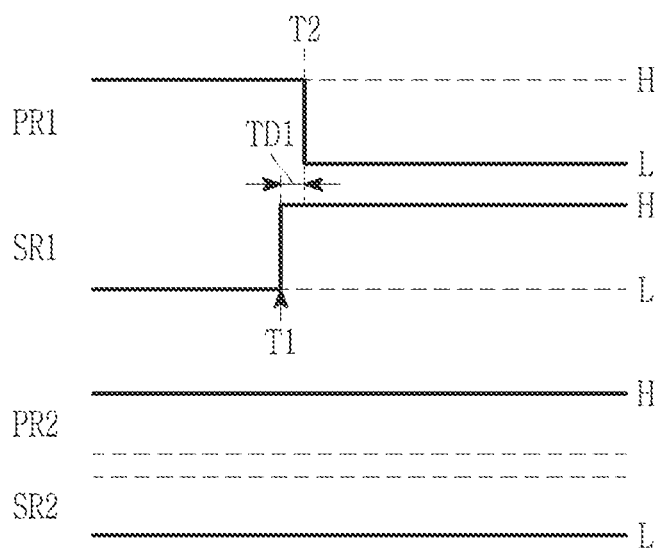
FIG. 3 shows a waveform of driving signals according to an embodiment described with reference to FIG. 2.

FIG. 3 shows a waveform of driving signals according to an embodiment described with reference to FIG. 2.

It will be assumed in FIG. 2 that a fault is generated to the battery cell CE3 of the battery cell module 22. The BMS 3 may stop an operation of the battery cell module group 200 including a battery cell module 22, and may control the battery system 1 to supply power to the motor with the battery cell module group 210.

The main control IC 32 may sense a fault of the battery cell CE3 of the battery cell module 22, may turn on the first sub-relay 30 so as to intercept the fault battery cell module group, and may generate a relay driving control signal (RDS) for turning off the first main relay 10. The above case corresponds to when a fault is generated to one of the four battery cells (CE1 to CE4) of the two battery cell modules 21 and 22.

A predetermined time delay exists between an On time of the first sub-relay 30 and an Off time of the first main relay 10.

Referring to FIG. 3, at a time T1, the relay driver 33 changes the relay driving signal SR1 to an On level (H) from an Off level (L), and after a predetermined delay time TD1 is passed, it changes the relay driving signal PR1 to the Off level (L) from the On level (H). For the delay time TD1, a closed loop is formed among the battery cell module 21, the battery cell module 22, the first sub-relay 30, and the first main relay 10, an excessive current flows, the fuse 11 is disconnected, and the loop is opened. Since no current flows though the first main relay 10, no stuck closed phenomenon is generated when the first main relay 10 is turned off. The delay time TD1 may be set by adding a predetermined margin to a time when the fuse 11 may be disconnected by the current flowing to the closed loop. For safe relay switching as described, an embodiment includes two fuses 11 and 16.

When the fuse 11 is not provided, the first sub-relay 30 is turned on and the first main relay 10 is turned off, so a theoretically infinite current flows to the corresponding closed loop, and the first main relay 10 is not opened by the stuck close but is maintained as closed. The current continuously flows to the corresponding closed loop, so the battery cells of the two battery cell modules 21 and 22 may generate heat and may be degraded, and a fire may occur because of the generation of heat. To solve the above-noted problem, when the first main relay 10 is turned off and the first sub-relay 30 is turned on, the entire current transmitted to the motor may be intercepted when the first main relay 10 is turned off, and the electric vehicle may suddenly stop.

In consideration of the above-noted points, a method for driving a relay according to an embodiment includes turning on the first sub-relay 30 while the first main relay 10 is closed, and turning off the first main relay 10 when the closed loop is disconnected by the fuse 11 is provided, and the current does not flow to the first main relay 10.

While the first main relay 10 and the first sub-relay 30 are switched, as shown in FIG. 3, the relay driving signal PR2 is maintained at the On level (H), the relay driving signal SR2 is maintained at the Off level (L), the second main relay 15 is closed, and the second sub-relay 35 is opened. Then, as shown in FIG. 2, power is supplied to the motor from the normal battery cell module group 210 along the current path PA1.

Figure 4:
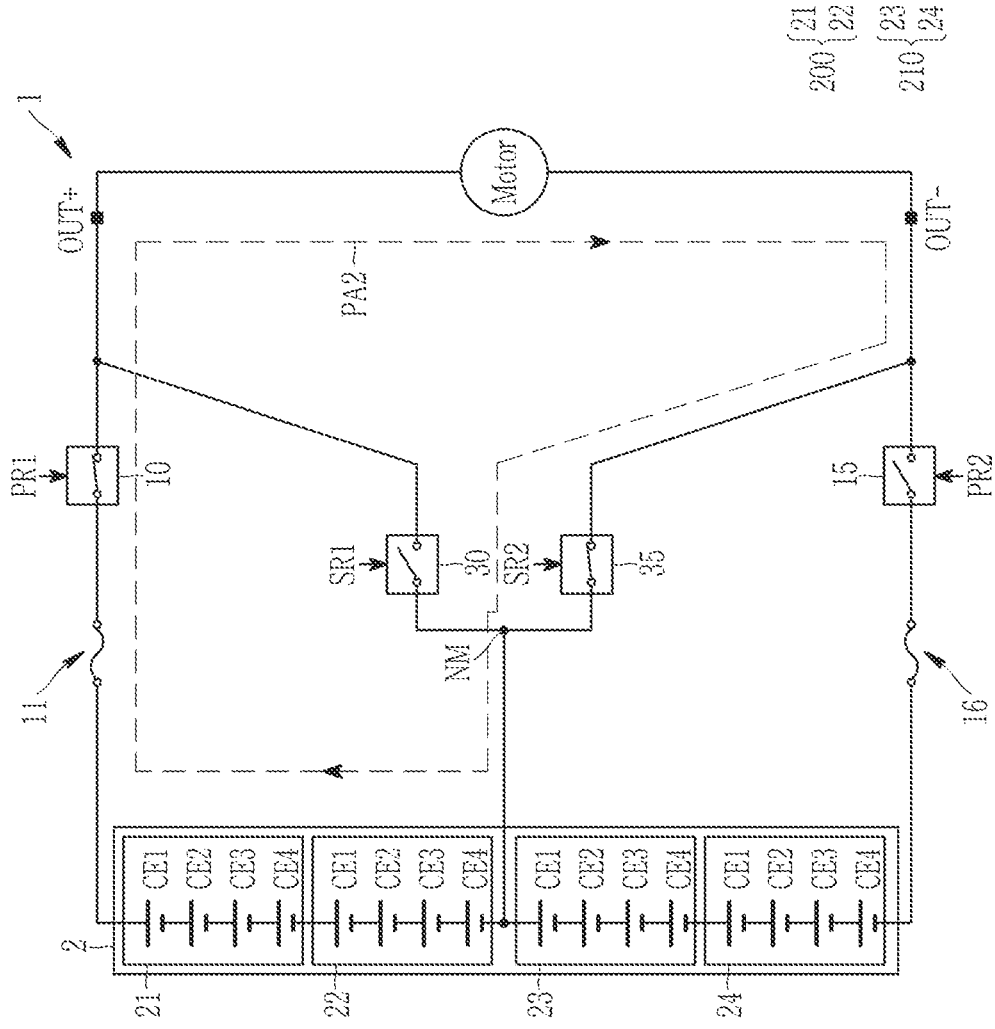
FIG. 4 shows an example of operating another of two battery cell module groups according to an embodiment.

FIG. 4 shows an example of operating another of two battery cell module groups according to an embodiment.

Figure 5:
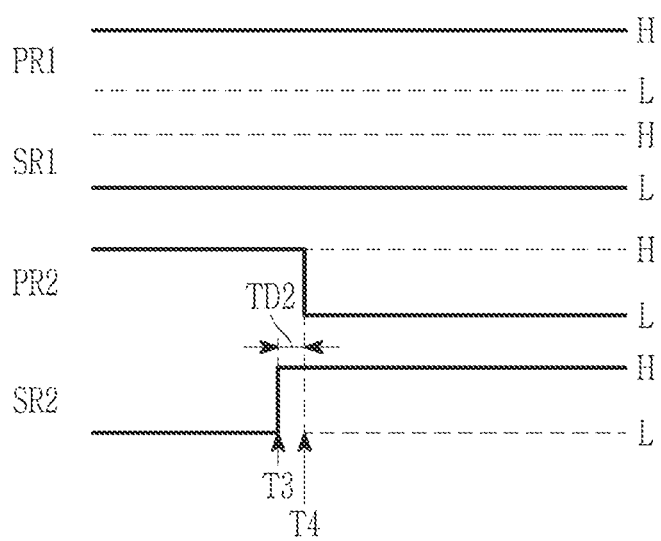
FIG. 5 shows a waveform of driving signals according to an embodiment described with reference to FIG. 4.

FIG. 5 shows a waveform of driving signals according to an embodiment described with reference to FIG. 4.

It will be assumed in FIG. 4 that a fault is generated to a battery cell CE2 of the battery cell module 23. The BMS 3 may stop an operation of the battery cell module group 210 including a battery cell module 23 and may control the battery system 1 so as to supply power to the motor with the battery cell module group 200.

The main control IC 32 may sense a fault of the battery cell CE2 of the battery cell module 23, may turn on the second sub-relay 35 to intercept the fault battery cell module group, and may generate a relay driving control signal (RDS) for turning off the second main relay 15. The above case corresponds to when a fault is generated to one of the four battery cells (CE1 to CE4) of the two battery cell modules 23 and 24.

A predetermined time delay TD2 exists between the On time of the second sub-relay 35 and the Off time of the second main relay 15 according to the same reason given in the description provided with reference to FIG. 2 and FIG. 3. The time delay TD2 may be different from the time delay TD1.

Referring to FIG. 5, at a time T3, the relay driver 33 changes the relay driving signal SR2 to the On level (H) from the Off level (L), and after a predetermined delay time TD2 has passed, it changes the relay driving signal PR2 to the Off level (L) from the On level (H). For the delay time TD2, a closed loop is formed among the battery cell module 23, the battery cell module 24, the second sub-relay 35, and the second main relay 15, and an excessive current flows, so the fuse 16 is disconnected and the loop is opened. No current flows to the second main relay 15, so no stuck close phenomenon is generated when the second main relay 15 is turned off. The delay time TD2 may be set by adding a predetermined margin to a time when the fuse 16 may be disconnected by the current flowing to the closed loop.

While the second main relay 15 and the second sub-relay 35 are switched, as shown in FIG. 5, the relay driving signal PR1 may be maintained at the On level (H), and the relay driving signal SR1 may be maintained at the Off level (L), the first main relay 10 is closed, and the first sub-relay 30 is opened. As shown in FIG. 4, power is supplied to the motor from the normal battery cell module group 200 along the current path PA2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A battery system comprising:
a battery cell assembly including at a first battery cell module and a second battery cell module;
a first fuse and a first main relay connected in series between a first end of the battery cell assembly and a first output end;
a second fuse and a second main relay connected in series between a second end of the battery cell assembly and a second output end;
a first sub-relay connected to a first node connected between the first battery cell module and the second battery cell module and a second node connected between the first output end and the first main relay;
a second sub-relay connected to the first node and a third node between the second output end and the second main relay; and
a battery management system (BMS) configured to:
control a charging and discharging of the first battery cell module and the second battery cell module, control the first main relay, the second main relay, the first sub-relay and the second sub-relay,
in response to a fault being detected by the BMS at a first battery cell of the first battery cell module positioned on a first side with respect to the first node, turn on the first sub-relay while the first main relay is closed, and turns off the first main relay after a first time delay occurs, and
in response to a fault being detected by the BMS at a second battery cell of the second battery cell module positioned on a second side with respect to the first node, turn on the second sub-relay while the second main relay is closed, and turns off the second main relay after a second time delay occurs,
wherein when the BMS detects the fault at the first battery cell module, the BMS is configured to stop an operation of the first battery cell module, and control the second battery cell module to supply power to a motor of an electric vehicle.

2. The battery system of claim 1, wherein
the BMS is further configured to disconnect the first fuse during the first time delay, and disconnect the second fuse during the second time delay.

3. The battery system of claim 1, wherein
when the BMS detects the fault at the second battery cell module, the BMS is configured to stop an operation of the second battery cell module, and control the first battery cell module to supply power to the motor of the electric vehicle.

4. The battery system of claim 1, wherein the BMS controls a first relay driving signal to turn on the first sub-relay,
wherein after a predetermined time following the first sub-relay turning on, the BMS controls a second relay driving signal to turn off the first main relay, and
wherein during the predetermined time, a closed loop is formed between the first battery cell module, the first sub-relay, and the first main relay.

5. A battery cell assembly comprising:
a first battery cell module group and a second battery cell module group, each of the first battery cell module group and the second battery cell module group including a plurality of battery cells;
a first fuse and a first main relay connected in series between a first end of the battery cell assembly and a first output end;
a second fuse and a second main relay connected in series between a second end of the battery cell assembly and a second output end;
a first sub-relay connected to a first node connected between the first battery cell module group and the second battery cell module group and a second node between the first output end and the first main relay;
a second sub-relay connected to the first node and a third node between the second output end and the second main relay; and
a battery management system (BMS) configured to:
in response to a battery cell being detected with a fault from among the first battery cell module group and the second battery cell module group, intercept the first battery cell module group including the battery cell with the fault from a corresponding node from among the second node and the third node by turning off the main relay corresponding to the first battery cell module group from among the first and second main relays, and connect the second battery cell module group and the corresponding node by turning on the sub-relay corresponding to the second battery cell module group from among the first and second sub-relays, wherein when the BMS detects the fault at the first battery cell module group, the BMS is configured to stop an operation of the first battery cell module group, and control the second battery cell module group to supply power to a motor of an electric vehicle.

6. The battery cell assembly of claim 5, wherein the battery management system turns on the corresponding sub-relay while the corresponding main relay is closed, and turns off the corresponding main relay after a predetermined time delay occurs.

7. The battery cell assembly of claim 6, wherein the fuse corresponding to the corresponding main relay from among the first and second fuses is disconnected during the time delay.

8. The battery cell assembly of claim 5, wherein the battery management system includes:
- a cell monitoring integrated circuit (IC) configured to obtain state information of the plurality of battery cells;
- a main control IC configured to receive the state information of the plurality of battery cells to determine the first battery cell module group, and generate a relay driving control signal for controlling driving of the first and second main relays and the first and second sub-relays; and
- a relay driver configured to generate a relay driving signal for driving the first and second main relays and the first and second sub-relays according to the relay driving control signal.

9. The battery cell assembly of claim 8, wherein the relay driver changes a second relay driving signal of the corresponding sub-relay to an On level while a first relay driving signal of the corresponding main relay is position in an On level, and changes the first relay driving signal to an Off level after a predetermined time delay occurs.

10. The battery cell assembly of claim 5, wherein when the first battery cell module group is connected between the first node and the first fuse, the battery management system turns on the first sub-relay while the first main relay is closed, and it turns off the first main relay after a predetermined time delay occurs.

11. The battery cell assembly of claim 10, wherein the first fuse is disconnected during the predetermined time delay.

12. The battery cell assembly of claim 5, wherein when the first battery cell module group is connected between the first node and the second fuse, the battery management system turns on the second sub-relay while the second main relay is closed, and it turns off the second main relay after a predetermined time delay occurs.

13. The battery cell assembly of claim 12, wherein the second fuse is disconnected during the predetermined time delay.

14. The battery cell assembly of claim 5, wherein when the BMS detects the fault at the second battery cell module group, the BMS is configured to stop an operation of the second battery cell module group, and control the first battery cell module group to supply power to the motor of the electric vehicle.

15. The battery cell assembly of claim 5, wherein the BMS controls a first relay driving signal to turn on the first sub-relay, wherein after a predetermined time following the first sub-relay turning on, the BMS controls a second relay driving signal to turn off the first main relay, and wherein during the predetermined time, a closed loop is formed between the first battery cell module group, the first sub-relay, and the first main relay.

\* \* \* \* \*